United States Patent

[11] 3,579,228

[72] Inventor Kenneth William Cattermole Harlow, England
[21] Appl. No. 700,874
[22] Filed Jan. 26, 1968
[45] Patented May 18, 1971
[73] Assignee International Standard Electric Corporation New York, N.Y.
[32] Priority Feb. 10, 1967
[33] Great Britain
[31] 6509/67

[54] ANALOG-TO-DIGITAL CONVERTER
10 Claims, 11 Drawing Figs.

[52] U.S. Cl. .......... 340/347
[51] Int. Cl. .......... H03k 13/17
[50] Field of Search .......... 340/347

[56] References Cited

UNITED STATES PATENTS

| | | | |
|---|---|---|---|
| 2,754,503 | 7/1956 | Forbes | 340/347 |
| 3,100,298 | 8/1963 | Fluhr | 340/347 |
| 3,119,105 | 1/1964 | Jepperson | 340/347 |
| 3,225,347 | 12/1965 | Doyle | 340/347 |
| 3,255,447 | 6/1966 | Sharples | 340/347 |

*Primary Examiner*—Maynard R. Wilbur
*Assistant Examiner*—Gary R. Edwards
*Attorneys*—C. Cornell Remsen, Jr., Rayson P. Morris, Percy P. Lantzy, Philip M. Bolton and Isidore Togut

ABSTRACT: An equilibrium type coder comprising an array of multistable and weighted stages interconnected with each other and the analog input to provide an input signal to each stage including the analog signal and weighted functions of the output signal of each stage. The weights of each stage as provided by weighted interconnects, or different biasing of the stages are such that the array has a plurality of stable states each corresponding to a different amplitude of the analog signal. The digital representation of the analog signal is provided by the state of the stages when the array is in a stable state.

Inventor
KENNETH W. CATTERMOLE
By Alfred C. Hill
Agent

Inventor
KENNETH W. CATTERMOLE
By Alfred C. Hill
Agent

Inventor
KENNETH W. CATTERMOLE
By Alfred C. Hill
Agent

ANALOG-TO-DIGITAL CONVERTER

BACKGROUND OF THE INVENTION

This invention relates to analog-to-digital converters such as used in pulse code modulation (PCM) systems of communication.

SUMMARY OF THE INVENTION

An object of this invention is to provide an improved analog-to-digital converter of the equilibrium type.

A feature of this invention is the provision of an analog-to-digital converter comprising an analog signal input; and an array of multistable and predeterminedly weighted stages interconnected with each other and the analog signal input to provide an input signal for each of the stages including in combination the analog signal and a weighted function of the output signal of each of the devices; the weights of each of the stages having a predetermined value to provide a plurality of stable states for the array, each of the stable states corresponding to a different amplitude of the analog signal; the digital representation of the analog signal being provided by the state of the stages when the array is in a stable state.

The term "multistable device" or stage as used in this specification and claims means a device or stage having two or more stable conditions. The term "weight" as used in this specification and claims means an arithmetical factor by which an energy value may be multiplied and a weight may have a positive or negative value or may be zero.

BRIEF DESCRIPTION OF THE DRAWING

The above mentioned and other features and objects of this invention will become more apparent by reference to the following drawings, in which.

DESCRIPTION OF THE PREFERRED EMBODIMENTS

The converters illustrated in the FIGS. employ one basic type of circuit, referred to herein as binary discriminators or bistable devices. A typical discriminator is derived from a pair of similar transistors having their emitters coupled together, the input to the circuit being to one of the transistor bases, the other base being fed with a bias signal. An out or outputs can be taken from either or both collectors. Such a circuit is commonly known as a "long-tail pair." Modifications to the basic discriminator circuit are quite straightforward and will be described when required.

Figure 1:
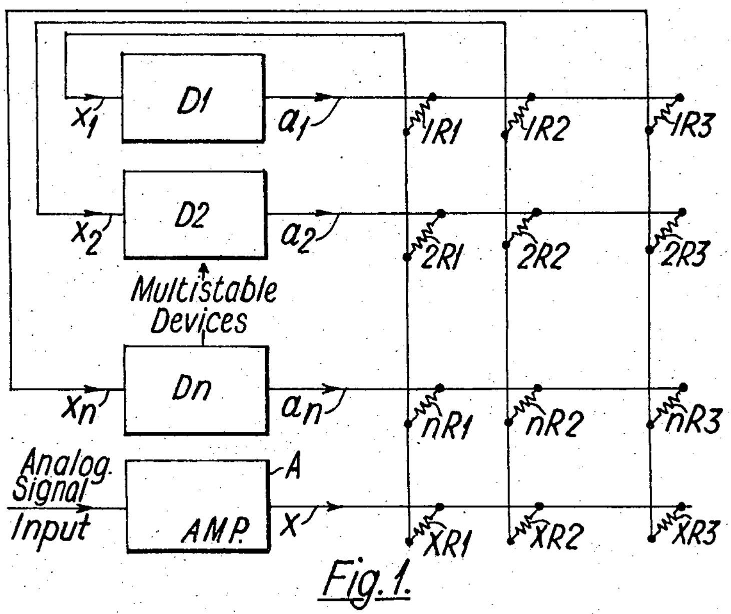
FIG. 1 is a block diagram illustrating the basic arrangement of one type of converter according to the principles of this invention.

The converter shown in FIG. 1 consists essentially of a number of multistable devices, bistable devices, or discriminators D1, D2...D*n*, one for each digit, an input amplifier A and an interconnection and feedback matrix having a plurality of weighting resistors 1R1, 1R2, 1R3...*n*R1, *n*R2, *n*R3 etc. Each discriminator gives a binary output $a_i$ whose value depends on the sign of the input $x_i$ to that discriminator.

The input analog signal is first amplified and the output of the amplifier A is termed $x$, and $x$ will henceforth be regarded as the input to the converter. The input $x$ is applied via the weighting resistors XR1, XR2, XR3, to the discriminator inputs. The input to discriminator D1 is now $x_l$ and so on, and the output of that discriminator becomes $a_l$ and so on. The outputs $a_1...a_n$ are coupled to the inputs via the relevant weighting resistors and so feedback is introduced.

It has previously been said that the arrangement of multistable devices, i.e. binary discriminators, is capable of holding one of a number of combinations of stable states, the particular stable state arrived at being one unique to the value of the analog input signal at that time (neglecting the small delays inherent in the circuits). Therefore, it must be established that:

i. It is possible to couple the digit devices in such a way that the only stable states are those giving a correct and complete encoding.

ii. It is possible to choose the dynamic properties of the digit devices in such a way that, whatever the initial conditions, the encoder proceeds through an autonomus sequence until it reaches the correct state, and then stops.

This will be proved by defining a mechanism which does it.

We start by deriving from the basic properties of quantization a general condition which must be satisfied by an encoder using weighted digits: this includes equilibrium encoders.

Let a set of N unit intervals (quanta) be defined by $n$ digits $a_i$ each of which has a weight $w_i$. An input signal $x$ is quantized to the next lower integer $[x]$ which equals the weighted sum of digits.

Then: $x-1<\sum a_i w_i \leq x$ (1)

The summation being taken over all the digits. Next, distinguish one digit $a_r$ and derive a relation between this digit and all the other quantities. It follows from equation (1) that:

$$x-1-\Sigma^1 a_i w_i < a_r w_r \leq x-\Sigma^1 a_i w_i \quad (2)$$

where the symbol $\Sigma^1$ denotes a partial summation omitting the term in $a_r$.

Now $a_r$ is a binary variable and takes the values 0 and 1 only. The left-hand inequality is strongest when $a_r=0$. In this event $x-1-\Sigma^1 a_i w_i<0$ But when $a_r=0$ the partial and complete summations differ only in a zero term, and so:

$$x-1-\Sigma a_i w_i<0 \quad (a_r=0). \quad (3)$$

The right hand inequality in equation (2) is strongest when $a_r=1$. In this event $x-\Sigma^1 a_i w_i \geqslant w_r$ But when $a_r=1$ the partial and complete summations differ by $w_r$, and so $$x-\Sigma\, a_i w_i \geqslant 0\ (a_r=1) \quad (4)$$

Inequalities (3) and (4) may be written in the common form:

$$x_{rn} \equiv x - + a_r - \sum a_i w_i < 0 \quad (a_r=0)$$
$$\geq 0 \quad (a_r=1) \quad (5)$$

Thus, for each digit $a_r$ there is defined a function $x_{rn}$ of the input $x$ and the digits $a_i$ whose sign depends on the value of $a_r$.

Consider the binary-number code, in which the weights are successive powers of two. The fundamental condition of equation (1) can then be written as $$x-1<\sum_{i=1}^{n} a_i 2^{n-i} \leq x \quad (6)$$

the summation being taken over all $n$ digits. This expresses the fact that the $n$ digits divide the range into $2^n$ unit intervals. Now it is equally true that the first $j$ digits divide the range into $2^j$ intervals of magnitude $2^{n1j}$. For instance, the first digit divides it into two halves (each $2^{n11}$ units): the first and second, into four quarters (each $2^{n12}$ units): and so on. This may be expressed in a form homologous with equation (6), $$x-2^{n-j}<\sum_{i=1}^{j} a_i 2^{n-i} \leq x \quad (7)$$

or, dividing throughout by $2^{n-j}$ $$\frac{x}{2^{n-j}}-1<\sum_{i=1}^{j} a_i 2^{j-i} \leq \frac{x}{2^{n-j}} \quad (8)$$

It follows, by a process exactly parallel to the derivation of equation (5), that:

$$\frac{x}{2^{n-j}}-\bar{a}_r-\sum_{i=1}^{j} a_i 2^{j-i}<0(a_r=0)$$
$$\geq 0(a_r=1) \quad (9)$$

for the first $j$ digits only, i.e. $r\,j$. The term $\bar{a}_r$ is the complement of the digit $a_r$. Multiplying by $2^{n1j}$ gives the equivalent form.

$$x_{rj} \equiv x-\bar{a}_r 2^{n-j}-\sum_{i=1}^{j} a_i 2^{n-i}<0(a_r=0)$$
$$\geq 0(a_r=1) \quad (10)$$

for the first $j$ digits, defining a function $x_{rj}$ whose sign depends on the value of $a_r$.

Consider an arbitrary digit $a_r$. By taking successively $j=r$, $r+1 \ldots n$ there is obtained $n-r+1$ pairs of inequalities similar to equation (10). One of these, namely for $j=n$, is the same as equation (5) with the weight values $w_i=2^{n11}$. One digit, namely the last, has this pair and no other: for all the other digits a choice is available. Now it may not be obvious at first sight which of the possible relations is the most significant. It will be shown later on that each of many different sets of relations specifies the essential properties of a different encoding mechanism. In particular, two mechanisms which will be described in some detail are specified respectively by choosing the relations:

Type 1 $j=n$ in equations (10)

Type 2 $j=r$ in equations (10).

The functions so defined are, respectively, $$x_{rn}=x-\bar{a}_r-\sum_{i=1}^{n} a_i 2^{n-i} \tag{11}$$

$$x_{rr}=x-\bar{a}_r 2^{n-r}-\sum_{i=1}^{r} a_i 2^{n-i}$$

$$=x-2^{n-r}-\sum_{i=1}^{r-1} a_i 2^{n-i} \tag{12}$$

It follows from the inequalities (10) that if $x_r$ denotes either $x_{rn}$ or $x_{rr}$ then $$x_r \begin{matrix} <0 \ (a_r=0) \\ \geq 0 \ (a_r=1) \end{matrix} \tag{13}$$

The set of inequalities (13) suggests an encoding mechanism and defines its stable states. An equilibrium encoder was defined above as an array of multistable devices, one per digit, suitably coupled to each other and to an input signal. Take the digit devices to be binary discriminators; each one gives a binary output $a_i$ whose value depends on the sign of the input $x_i$, thus:

$$a_i=0 \text{ if } x_i<0$$
$$a_i=1 \text{ if } x_i \geq 0 \tag{14}$$

The couplings may be represented by taking for each $x_i$ a weighted sum of all the digit outputs $a_i$ and of the input signal $x$, as in the block diagram of FIG. 1. The connections at the crosspoints of the matrix symbolize weighting resistor networks, such as are commonly used in decoders, summing amplifiers etc.

In terms of this mechanism, the inequalities (5), (10) and (13) suggest the use of the functions $x_{rn}$ or $x_{rr}$ as discriminator inputs. Considering first the Type 1 encoder. the weighting matrix is $x_r=x_{rn}\equiv x-\sum a_i w_i-\bar{a}_r$ (15) where $\bar{a}_r$ is the complement of the digit $a_r$. Now the fiist two terms are common to all digits, so that the block diagram of FIG. 1 can be simplified to the block diagram of FIG. 2, using weighting matrix WM as defined in equation (15) to generate the first two terms only and producing $\bar{a}_r$ by local feedback in each discriminator.

Figure 2:
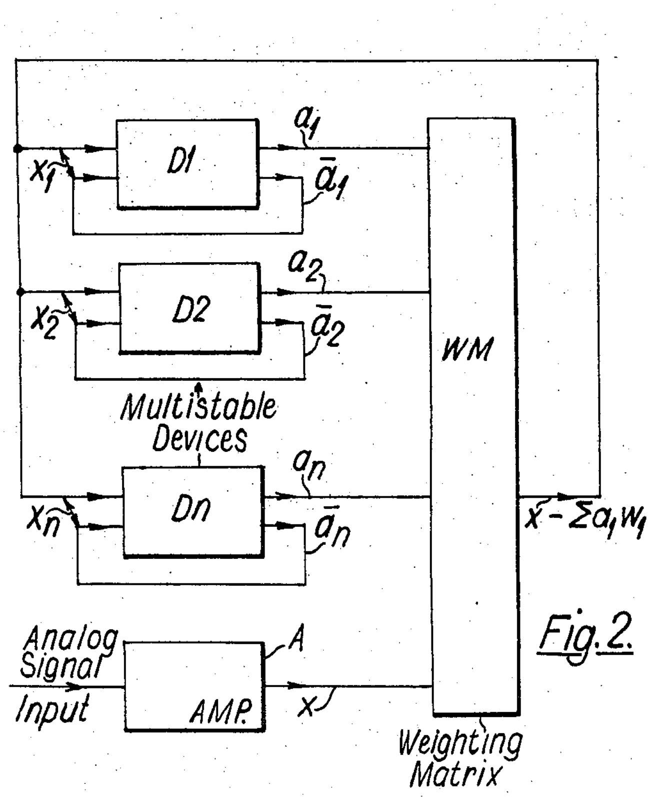
FIG. 2 is a block diagram illustrating a modified version of the converter of FIG. 1.

The converter of FIG. 2 uses the same basic discriminators D1...D$n$ as the converter of FIG. 1 but they are now assumed to have been modified to have differential inputs, which is easily arranged. By providing a resistor coupling between the bias input to the long tail pair and the collector of the other transistor the discriminator is turned into a bistable flip-flop, or Schmitt trigger circuit. The feedback connection provides in each discriminator the individual term $\bar{a}_r$ in equation (15). Each discriminator in FIG. 2 has a hysteresis of 1 quantum on the amplitude scale.

This encoding mechanism embodies inequalities which are entailed by the basic encoding rule, and, therefore, it is expected to have stable states which represent a correct encoding of the input. It is less obvious that these are the only states, but it is possible to prove this by arranging the previous argument backwards. First, consider an arbitrary input $x$ to be correctly encoded, so that equation (1) is satisfied. Then:

$$0 \leq x-\sum a_i w_i<1 \tag{16}$$

and, hence, from equation (15) $\begin{matrix} x_r \geq 0 \text{ if } a_r=1 \\ x_r<0 \text{ if } a_r=0 \end{matrix}$ But, by the property of equation (14) of the binary discriminators, these inputs are such as to lock them in their respective binary values $a_i$, and so this state is stable. Now let $x$ be changed until equation (16) is violated, which means that the encoding is no longer correct. If $x$ is too great, so that $x-\Sigma a_i w_i$ 1, then $x_r$ 0 for all $r$. Thus, any units in the binary 0 condition are driven to the binary 1 condition. If $x$ is too small, so that $x-\sum a_i w_i \gg 1$, then $x_r \geq 0$ for all $r$. Thus, any units in the binary 1 condition are driven to the binary 0 condition. Thus, a state which represents an incorrect encoding is not stable and cannot persist.

So far, it has not be necessary to specify the weights $w_i$. All the above reasoning with respect of the Type 1 encoder applies to any weighted code. With weight allocations corresponding to a redundant code, these may be alternative characters which make up the same weighted sum and further constraints would be needed to ensure that the right one were chosen every time. This complication does not arise with the binary-number code, for which $w_i=^{n1i}$ (17)

and there is a unique set of digits $a_i$ for every possible sum.

One form of misbehaviour, namely, stability in wrong states, has been proven not to occur. The other possible form, namely, persistent instability, can be eliminated by a correct choice of dynamic properties. It is easy to see what must not be allowed to happen. Suppose that all the digit discriminators would respond simultaneously. Then any input $x$ above the first threshold would turn them all on. Unless $x$ were also above the last threshold, the feedback would then turn them all off again, and so on.

By an extension of this argument, it may be shown that no two digits may be allowed to consistently switch simultaneously. For example, suppose that $x<\Sigma a_i w_i<x+h$, (18) where $h$ is a positive integer and that the resulting negative $x_i$ cause two or more digits to change from 1 to 0, diminishing the weighted sum by $h+1$. The $x_i$ now becomes positive, tending to change the digits from 0 back to 1. If the same combination reverts simultaneously, the original state is restored. Now, for two or more positive integral weights, their sum must be at least 2. Hence, $h \geq 1$, and a range of inputs satisfying equation (18) exists. Thus, for any combination of simultaneously operating digits, there is some input level which will provide oscillation between two codes, one too high and one too low.

In practice, discriminators cannot respond instantaneously, there must be a delay. One way of avoiding simultaneous operation is to make all the delays different. Suppose that the discriminator giving $a_i$ has a characteristic delay $t_i$. It responds to a sustained input only after a delay $t_i$ and it does not respond at all to an input signal shorter than $t_i$. It is still possible for a step in the input to cause several digits to change (not simultaneously, but in quick succession) and the weighted sum to overshoot. But when the reversal occurs, the first digit to go back differs from the last one to go forward, and so the oscillation between two wrong codes differing in several digits is avoided.

Oscillation of a single digit must also be prevented, and this suggests the choice of delays $t_i$. Instability can occur if $h+1 \geq 2$ (see inequality (18) and ensuing discussion) and, hence, a single weight of 2 or more can be switched on and off repeatedly. Therefore, a digit controlling such a weight must never be the first digit to change: the digit with weight 1 must have a faster response than any other.

Consider now a specific case which uses:

i. Binary weights according to equation (17).

ii. Quantized response times ranging from T to $n$T.

Thus:

$t_i=(N-i+1)\,T$ (19)

The encoding operations then follow a sequence drawn from a repertoire which will now be defined. First choose a notation. Let the binary number $a_1 a_2 \ldots a_n$ be noted by $y$, and the input signal by $x$. The encoder starts in an initial state $y_o$ and changes state at intervals which are multiples of I, the shortest response time. It passes through states $y_1$, $y_2 \ldots y_j$ at times T, 2T...$j$T and reaches a final state $y_s$ after a time $s$T. If the encoding is to be correct, then $y_s$=[ ]. It will be shown that the sequence coverges to a correct encoding, and that an upper bound to the number of time intervals is:

$$s \leq 1/2\ n(n+1) \qquad (20)$$

As a concrete illustration, consider an 8-level encoder with weights 1, 2 and 4. Its sequences starting from $y_o=0$ and converging to $y_s=0$, 1, 2...7 are shown in FIG. 3*a*. The principle governing these sequences is:

i. If $y<y_s$, then each of the weights are off ($a_i=0$) and turn on in the order 1, 2, 4 with delays T, 2T, 3T respectively.

ii. If $y>y_s$, then each of the weights as are on ($a_i=1$) and turn off in the same order.

The delays are measured from the instant when the discriminator input $x_i$ changes sign. For instance, with $y_o=0$ and $y_s=[x]\geqslant 4$, all digits change from 0 to 1 at times T, 2T, 3T for digits 3, 2, 1, respectively. If also $y_s<7$, the result is an overshoot which reverses $x_3$ and $x_2$ at time 3T: digits $a_3$, $a_2$ change back to 0 with further delays T, 2T. With $y_s<4$, digit 1 does not change since $x_1$, having moved positively at $t=0$, becomes negative again before the delay 3T has elapsed.

Figure 3:
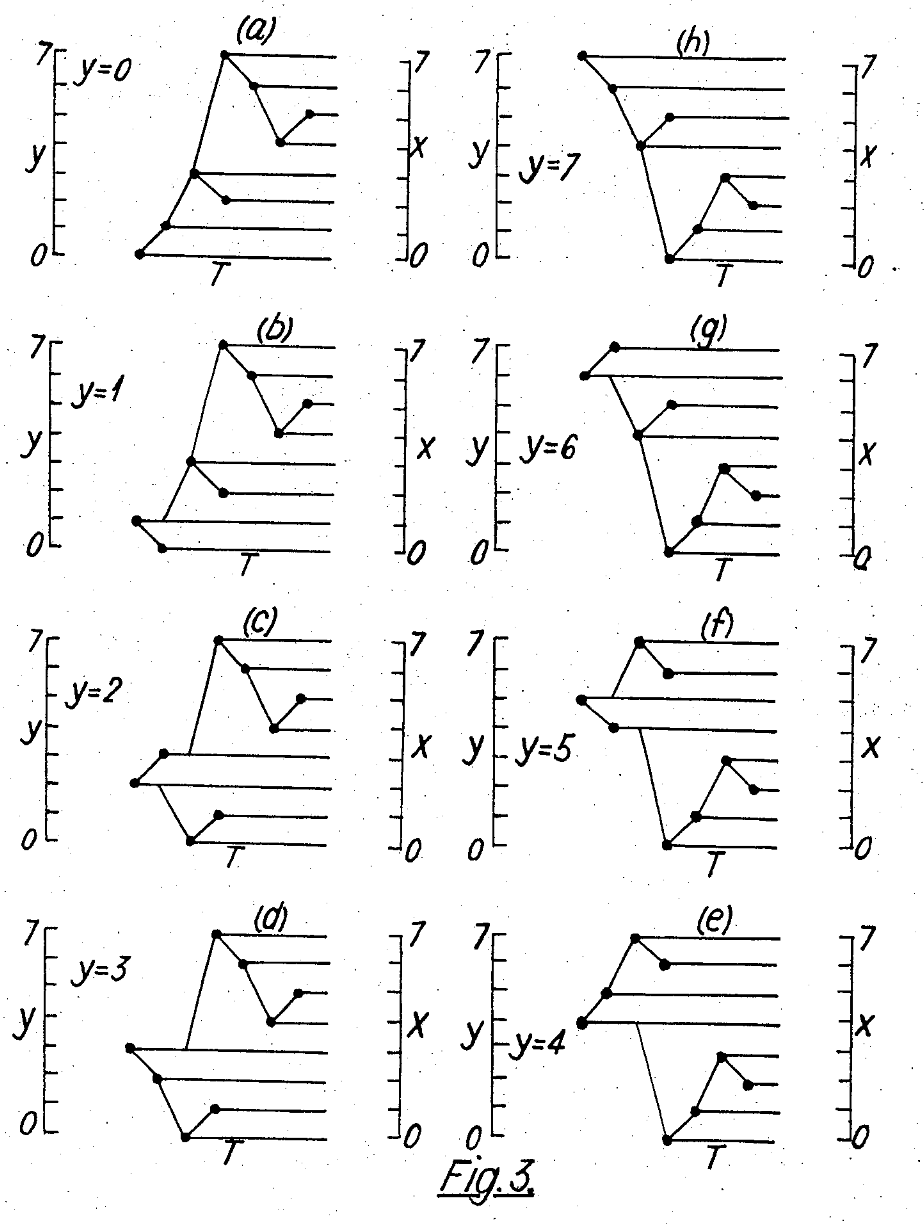
FIGS. 3*a* to 3*h* are a set of operating sequence diagrams illustrating the operation of the converters shown in FIGS. 1 and 2.

It is fundamental to the present encoder that the initial condition need not be defined. It will converge to any encoded value $y_x$ from any starting-point $y_o$. The remainder of FIG. 3 shows the sequences starting from $y_i=1$, 2...7, respectively. Actually, there is no need to work out sequences for the last four values, since it is obvious from the rules that they are complementary to the others. The diagram displays this clearly. The greatest value of $s$ is 6, in accordance with the inequality (20). This is attained for $y_s=101$ (in binary-number form) with $y_o=0xxx$ and for $y_s=010$ with $y_o=1xx$. It is clear from the diagram that these are the worst cases because every possible overshoot occurs. To obtain the first digit, the largest weight has to be reversed which takes 3T. To obtain the second digit, the next largest weight has to be reversed again which takes 2T, and so on. This result is easily generalized. With an $n$-digit binary-number code and initial condition $a_1 a_2 \ldots a_n$ the longest sequence is the one leading to $y_s=\overline{a}_1 a_1 \overline{a}_1 a_1 \overline{a}_1 a_1 \ldots$, since every digit must be reversed in descending order of weight. The time taken, as a multiple of the unit T, is $s=n+(n-1)+(n-2)+\ldots+1=\rho(n+)$. (21)

No other sequence is as long as this, and so the inequality (20) is proven.

This time is of course a rather large multiple of the unit time T, but T itself, which is basically the time needed to make a binary decision, can be short. The digit period of a normal sequential encoder needs to be of the order $n$T, given the same basic devices, so that its encoding time is $n^2$T which is greater than the maximum $s$T quoted above.

Figure 4:
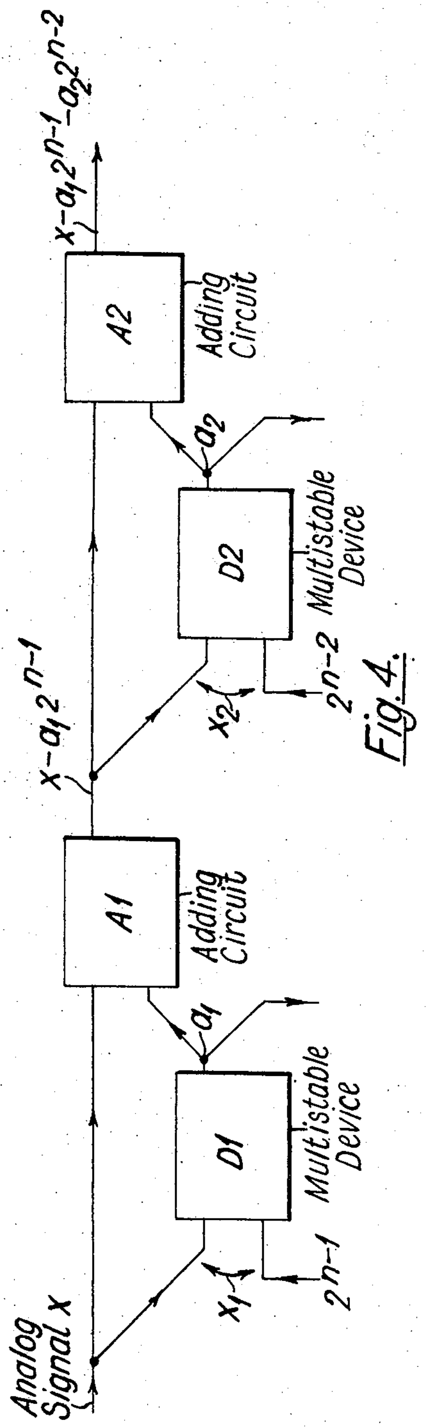
FIG. 4 is a block diagram of an alternative type of converter according to the principles of this invention.

The type 2 encoder uses as discriminator inputs the functions $x_{rr}$ as defined in equation (12). FIG. 4 shows the essential parts of such an encoder. In this embodiment each digit is generated by a stage consisting essentially of a discriminator D1, D2 etc. and an adder A1, A2 etc., the stages being connected together in a tandem structure. Each stage, as shown, receives as its input the combination of a weighted function of the inputs and a weighted function of the output from each previous stage only. It may be thought at first sight that the arrangement of FIG. 4 is in conflict with the previous statement that each discriminator input is a combination of a weighted function of the input and a weighted function of each output from all the other discriminators, but this is not so. In the case of FIG. 4 the weight assigned to the output of any succeeding stage is zero, hence, a simplified arrangement compared with FIG. 1, for example.

The discriminators of FIG. 4 are basically the same as those of FIG. 1, i.e. a long-tail pair, with the difference that the bias applied to each discriminator is determined by its weight. Hence, D1 is subjected to a bias voltage $2^{n11}$, D2 has a bias voltage $2^{n11}$, and so on. The output from each discriminator is then taken, together with the input to that stage, to a weighted adder where the two values are added and weighted to provide the input for the next stage. It is easily verified that the input $x_r$ to discriminator $D_r$ is identical with $x_{rr}$ as defined above.

It is clear from the derivation that states which represent a correct encoding are stable, but it is not immediately obvious that they are the only stable states. If the input $x$ is correctly encoded, then equation (7) is satisfied (in particular, for $j=r$) and so $$0 \leq x-\sum_{i=1}^{r} a_i 2^{n-i} < 2^{n-r} \qquad (22)$$

Hence, from equation (11)

$$x_r \geq 0 \text{ if } a_r=1$$
$$x_r < 0 \text{ if } a_r=0 \qquad (23)$$

By the property of the binary discriminators, expressed in equation (–), these inputs are such as to lock them in their respective binary values, and so this state is stable. Now let $x$ be changed so that the encoding is incorrect. Then equation (22) is violated, at least for some value of $r$. First, let $x$ be reduced until the left-hand inequality in equation 22 ) is untrue for some values of $r$. The $x_r<0$ and, if $a_r$ was in the 1 condition it is driven to the 0 condition. Which digit will be first affected? Clearly the one for which the summation in equation (22) is greatest, namely, the least significant digit which is in the 1 condition. Thus, an incorrect code whose weighted sum is too great is unstable.

If $x$ be increased until the right-hand inequality in equation (22) is untrue for some value of $r$, then $x_r\geq 0$ and if $a_r$ was 0 it is driven to 1. The digit first affected is most easily identified by rewriting equation (22) in terms of the digit complements $\overline{a}_i$:

$$0 < 2^n - x - \sum_{i=1}^{r} a_i 2^{n-i} \leq 2^{n-r} \qquad (24)$$

As $x$ increases, the left-hand inequality is first violated in respect of the digit for which the summation in equation (24) is greatest, namely, the least significant digit which is a 0. This digit is driven to 1, and so an incorrect code whose weighted sum is too small is also unstable. The two parts of the proof taken together show that the only stable states represent correct encodings.

The operating sequence of this encoder is defined by the static properties, and the modes of instability which had to be eliminated in the first embodiment by choice of delay times do not arise. If the input be increased slowly then (*i*) as a threshold is traversed, the first weight which is required for the higher but not the lower level turns on. (*ii*) As this takes effect, the weighted sum overshoots the signal level and the first weight which is used in the lower level but is not required for the higher turns off. (*iii*) This process continues in a similar manner until the correct code is reached. The sequences are similar to those of the previously-described encoder even though they are determined by a different mechanism. There is no need to introduce any deliberate delay, and so the delay time of each digit unit may be as short as the devices and construction will allow. If it is supposed that any digit may be switched in the time T (as defined earlier) then the longest sequence occupies a time $n$T. The worst case is the same as for the previous encoder, namely, the generation of code 1010-—from an initial state 0*xxx*—(or the complementary process). In the first interval all digits switch to 1. In the next interval, all but $a_1$ revert to 0. Then all but $a_2$ switch back to 1 again, and so on. The sequence is the same as in FIG. 3, except that successive transitions in the same direction are now simultaneous rather than staggered.

It should be noted that the various operations may overlap one another. It is not necessary to wait for the end of one operation before initiating another.

It will be seen that the structure shown in FIG. 4, comprises a number of tandem units, each of which (i) accepts an input signal, (ii) generates one more digit, and (iii) passes on a residual signal to the next unit.

The form of this residue follows from equation (12), which shows that $$x_{r+1}-x_r=\overline{a}_r 2^{n-r}-2^{n-r-1}=2^{n-r-1}-a_r 2^{n-r} \qquad (25)$$

Each unit comprises a discriminator D and weighted adder A. The residue constructed by $A_r$ is $a\ a_{r+1}+2^{n1r11}$, so the discriminators need to be differential as previously described.

This structure is important because it shows clearly that the encoder is stable. A mechanism with multiple feedback loops, as FIG. 1 or 2, is not obviously stable: proof of stability must be adduced. A structure such as that of FIG. 4 which is equivalent to a chain with one-way propagation must be stable, and so whatever the dynamics of the individual units this form of equilibrium-seeking encoder cannot oscillate. The nature of the proof implies a condition: provided that the weight $w_i$ contributing to decision function $x_r$ is truly the same for all values of $r>i$.

The basic theory leading up to the relation of equation (10) gives $n-r+1$ pairs of inequalities for the $r$th digit. Most of these have remained unused. Consider now how they are applicable to encoding structures.

As a generalization of equation (11) or equation (12), it is possible to define:

$$x_{rj}=x-\bar{a}_r 2^{n-j}-\sum_{i=1}^{j} a_i 2^{n-i} \text{ (for } r\leq j) \qquad (26)$$

and linear combinations of these quantities, i.e.

$$x_r=\sum_{j=r}^{n} b_{rj} x_{rj} \qquad (27)$$

where the values $b_{rj}$ are non-negative and not all zero but otherwise arbitrary. These form a valid set of decision functions for an encoder, in that the stable states correspond to correct encodings.

The embodiment of FIG. 2 follows from putting $b_{rn}=1$ and all other $b=0$. The embodiment of FIG. 4 follows from putting $b_{rr}=$ and all other $b=0$. This is best illustrated by writing the coefficients $b$ in a matrix, thus;

| | | | | | |
|---|---|---|---|---|---|
| Generalized encoder | $b_{11}$ | | $b_{12}$ | $b_{13}$ ............ | $b_{1n}$ |
| | 0 | | $b_{23}$ | $b_{23}$ ............ | $b_{2n}$ |
| | 0 | | 0 | $b_{33}$ ............ | $b_{3n}$ |
| | . | | | | . |
| | . | | | | . |
| | . | | | | . |
| Type 1 encoder | 0 | 0 | 0 | ............ | $b_{nn}$ |
| | 0 | 0 | 0 | ............ | 1 |
| | 0 | 0 | 0 | ............ | 1 |
| | 0 | 0 | 0 | ............ | 1 |
| | . | | | | . |
| | . | | | | . |
| Type 2 encoder | 0 | 0 | 0 | ............ | 1 |
| | 1 | 0 | 0 | ............ | 0 |
| | 0 | 1 | 0 | ............ | 0 |
| | 0 | 0 | 1 | ............ | 0 |
| | . | | | | . |
| | . | | | | . |
| | . | | | | . |
| | 0 | 0 | 0 | ............ | 1 |

The restrictions on the matrix of the generalized encoder are: (*i*) there must be at least one nonzero element in each row, and (*ii*) all nonzero elements must be on or above the leading diagonal.

While I have described above the principles of my invention in connection with specific apparatus, it is to be clearly understood that this description is made only by way of example and not as a limitation to the scope of my invention as set forth in the objects thereof and in the accompanying claims.

I claim:

1. An analog-to-digital converter comprising:
an analog signal input; and
an array of multistable binary weighted stages interconnected with each other and said analog signal input to provide for each of said stages an input signal including in combination said analog signal and a binary weighted function of the output signal of each of said stages;
the weights of each of said stages having a predetermined value to provide a plurality of stable states for said array, each of said stable states corresponding to a different amplitude of said analog signal;
the digital representation of said analog signal being provided by the state of said stages when said array is in a stable state.

2. A converter according to claim 1, wherein:
each of said stages include a multistable device.

3. A converter according to claim 2, wherein
said multistable devices are bistable devices.

4. A converter according to claim 1, wherein
said stages include a multistable device for each of said stages, and
weighted interconnections to couple the output of each of said devices and said analog signal input to the input of each of said devices.

5. A converter according to claim 4, wherein
said multistable devices are bistable devices.

6. A converter according to claim 5, wherein
said interconnections provide an input signal to each of said bistable devices equal to $x-\Sigma a_i w_i-\bar{a}_r$, where $x$ is the value of said analog signal, $\Sigma a_i W_i$ is the summation of the output digits $a_i$ of each of said bistable devices each of said digits $a_i$ having a weight $w_i$ and $a_r$ is the compliment of said output digits $a_i$ of each of said bistable devices.

7. A converter according to claim 6, wherein each of said bistable devices include an input, an output, a complementary output, and
a feedback path between said complementary output and said input to provide the term $\bar{a}_r$ for said input signal $x_r$ thereto; and said interconnections provide the terms $x-\Sigma a_i w_i$ of said input signal $x_r$ to each of said bistable devices.

8. A converter according to claim 1, wherein
each of said stages responds to an input signal applied thereto after a given time delay, each of said stages having a different time delay being arranged in the order such that said stage with the smallest weight has the shortest time delay.

9. A converter according to claim 1, wherein
said stages are coupled in series relationship with respect to each other and said analog signal input;
the first of said stages including
a multistable device coupled to said analog signal input, and
an adding circuit coupled to said analog signal input and the output of said device;
the remainder of said stages except the last of said stages including:
a multistable device coupled to the output of the adding circuit of the immediately preceding one of said stages; and
an adding circuit coupled to the output of the adding circuit of the immediately preceding one of said stages and said device of its stage; and the last of said stages include; a multistable device coupled to the output of the adding circuit of the immediately preceding one of said stages.

10. A converter according to claim 9, wherein
each of said multistable devices include a source of different bias voltage to provide the desired weighting for each of said stages.